US006899994B2

(12) United States Patent
Huang et al.

(10) Patent No.: US 6,899,994 B2
(45) Date of Patent: May 31, 2005

(54) ON-PRESS DEVELOPABLE IR SENSITIVE PRINTING PLATES USING BINDER RESINS HAVING POLYETHYLENE OXIDE SEGMENTS

(75) Inventors: Jianbing Huang, Trumbull, CT (US); Heidi M. Munnelly, Windsor, CO (US); Shashikant Saraiya, Parlin, NJ (US); Socrates Peter Pappas, Juno Beach, FL (US)

(73) Assignee: Kodak Polychrome Graphics LLC, Norwalk, CT (US)

( * ) Notice: Subject to any disclaimer, the term of this patent is extended or adjusted under 35 U.S.C. 154(b) by 83 days.

(21) Appl. No.: 10/119,454

(22) Filed: Apr. 10, 2002

(65) Prior Publication Data

US 2003/0064318 A1 Apr. 3, 2003

Related U.S. Application Data

(63) Continuation-in-part of application No. 09/826,300, filed on Apr. 4, 2001, now Pat. No. 6,582,882.

(51) Int. Cl.$^7$ .............................. G03C 1/73; G03C 1/76; G03F 7/032; G03F 7/028; G03F 7/20; G03F 7/30

(52) U.S. Cl. .............................. 430/271.1; 430/281.1; 430/285.1; 430/280.1; 430/300; 430/306; 430/328; 430/330; 430/331; 430/325; 430/905; 430/916; 430/944

(58) Field of Search ...................... 430/271.1, 270.1, 430/273.1, 325, 302, 330, 331, 328, 905, 906, 907, 910, 944, 945, 281.1, 285.1, 280.1, 916, 306, 300

(56) References Cited

U.S. PATENT DOCUMENTS

| | | | |
|---|---|---|---|
| 4,997,745 A | 3/1991 | Kawamura et al. | 430/281 |
| 5,204,222 A | 4/1993 | Gersdorf et al. | 430/281 |
| 5,491,046 A | 2/1996 | DeBoer et al. | 430/302 |
| 5,496,903 A | 3/1996 | Watanabe et al. | 526/204 |
| 5,545,676 A | 8/1996 | Palazzotto et al. | 522/15 |
| 5,599,650 A | 2/1997 | Bi et al. | 430/273.1 |
| 5,658,708 A | 8/1997 | Kondo | 430/288.1 |
| 5,756,258 A | 5/1998 | Yamaoka et al. | 430/281.1 |
| 5,763,134 A | 6/1998 | Busman et al. | 430/157 |
| 5,800,965 A | 9/1998 | Tsuji et al. | 430/287.1 |
| 5,914,215 A | 6/1999 | West et al. | 430/278.1 |
| 5,948,599 A | 9/1999 | Gardner et al. | 430/330 |
| 6,022,667 A | 2/2000 | Vermeersch et al. | 430/271.1 |
| 6,037,102 A | 3/2000 | Loerzer et al. | 430/306 |
| 6,071,369 A | 6/2000 | Vermeersch et al. | 156/272.8 |
| 6,071,675 A | 6/2000 | Teng | 430/302 |
| 6,245,481 B1 | 6/2001 | Teng | 430/270.1 |
| 6,245,486 B1 | 6/2001 | Teng | 430/303 |
| 6,309,792 B1 | 10/2001 | Hauck et al. | 430/270.1 |
| 6,489,078 B1 * | 12/2002 | Van Damme et al. | 430/170 |
| 2003/0075066 A1 * | 4/2003 | Tan et al. | 101/453 |

FOREIGN PATENT DOCUMENTS

| | | |
|---|---|---|
| DE | 19648311 | 5/1997 |
| EP | 0415187 | 3/1991 |
| EP | 0514145 | 11/1992 |
| EP | 0522175 | 1/1993 |
| EP | 0599510 | 6/1994 |
| EP | 0672544 | 9/1995 |
| EP | 0672954 | 9/1995 |
| EP | 0730201 | 9/1996 |
| EP | 0816070 | 1/1998 |
| EP | 0819980 | 1/1998 |
| EP | 0819985 | 1/1998 |
| EP | 0823327 | 2/1998 |
| EP | 0839647 | 5/1998 |
| EP | 0881096 | 12/1998 |
| EP | 1117005 | 7/2001 |
| JP | 52102023 | 8/1977 |
| JP | 6068992 | 9/1983 |
| JP | 62121445 | 6/1987 |
| JP | 2-277695 | 11/1990 |
| JP | 1138633 | 7/1997 |
| WO | 9739894 | 10/1997 |
| WO | 0048836 | 8/2000 |

OTHER PUBLICATIONS

Full English translation of JP 52–102023 which was applied in the final Office action provided by USPTO.*
Guo, et al. *Effects of salt on the intrinsic viscosity of model alkali–soluble associative polymers*, Molecular Chemistry and Physics, 199(6), pp. 1175–1184.
U.S. Patent Application for "Imageable Element Comprising Graft Polymer", U.S. Appl. No. 09/826,300.
U.S. Patent Application for "Thermal Initiator System Using Leuco Dyes and Polyhalogene Compounds", U.S. Appl. No. 09/832,989.
U.S. Patent Application for "High Speed Negative Working Thermal Printing Plates", U.S. Appl. No. 10/040,241.
U.S. Patent Application for "On–Press Developable IR Sensitive Printing Plates" by Hans–Joachim Timpe and Friederike Von Gyldenfeldt, U.S. Appl. No. 10/066,874.

* cited by examiner

*Primary Examiner*—Cynthia Kelly
*Assistant Examiner*—Sin J. Lee
(74) *Attorney, Agent, or Firm*—Faegre & Benson LLP (57) ABSTRACT

The present invention relates to a polymerizable coating composition suitable for the manufacture of printing plates developable on-press. The coating composition comprises (i) a polymerizable compound and (ii) a polymeric binder comprising polyethylene oxide segments, wherein the polymeric binder is selected from the group consisting of at least one graft copolymer comprising a main chain polymer and polyethylene oxide side chains, a block copolymer having at least one polyethylene oxide block and at least one non-polyethylene oxide block, and a combination thereof. The invention is also directed to an imageable element comprising a substrate and the polymerizable coating composition.

56 Claims, 4 Drawing Sheets

ON-PRESS DEVELOPABLE IR SENSITIVE PRINTING PLATES USING BINDER RESINS HAVING POLYETHYLENE OXIDE SEGMENTS

CROSS REFERENCE TO RELATED APPLICATIONS

This application is a continuation-in-part of U.S. patent application Ser. No. 09/826,300, filed Apr. 4, 2001, now U.S. Pat. No. 6,582,882, which is incorporated herein by reference.

BACKGROUND OF THE INVENTION

1. Field of the Invention

The present invention relates to on-press developable negative-working printing plates which can be exposed by UV, visible, and infrared radiation. In particular, the present invention relates to printing plates comprising polymeric binders containing polyethylene oxide segments.

2. Background of the Invention

Radiation-sensitive compositions are routinely used in the preparation of high-performance printing plate precursors. There are primarily two ways of improving the properties of radiation-sensitive compositions and thus also of the corresponding printing plate precursors. The first way addresses improvement of the properties of the radiation-sensitive components in the compositions (frequently negative diazo resins or photoinitiators). The other way deals with improvement of physical properties of the radiation-sensitive layers through the use of novel polymeric compounds ("binders").

The latest developments in the field of printing plate precursors deal with radiation-sensitive compositions which can be imagewise exposed by means of lasers or laser diodes. This type of exposure does not require films as intermediate information carriers since lasers can be controlled by computers.

High-performance lasers or laser diodes which are used in commercially available image-setters emit light in the wavelength ranges of between 800 to 850 nm and between 1060 and 1120 nm, respectively. Therefore, printing plate precursors, or initiator systems contained therein, which are to be imagewise exposed by means of such image-setters have to be sensitive in the near IR range. Such printing plate precursors can then basically be handled under daylight conditions which significantly facilitates their production and processing.

There are two possible ways of using radiation-sensitive compositions for the preparation of printing plates. For negative printing plates, radiation-sensitive compositions are used wherein after an imagewise exposure the exposed areas are cured. In the developing step, only the unexposed areas are removed from the substrate. For positive printing plates, radiation-sensitive compositions are used whose exposed areas dissolve faster in a given developing agent than the non-exposed areas. This process is referred to as photosolubilization.

Negative-working plates typically require after imagewise exposure a preheating step, as described for example in EP 0 672 544, EP 0 672 954 as well as U.S. Pat. No. 5,491,046 and EP 0 819 985. These plates require a preheating step within a very narrow temperature range which only causes a partial crosslinking of the image layer. To meet current standards regarding the number of printable copies and the resistance to press room chemicals, an additional heating step—referred to as a post bake step—is carried out during which the image layer is crosslinked further.

U.S. Pat. No. 4,997,745 describes photosensitive compositions comprising a dye absorbing between 300 and 900 nm and a trihalomethyl-s-triazine compound.

In U.S. Pat. No. 5,496,903 and DE 196 48 313, photosensitive compositions are described which in addition to a dye absorbing in the IR range comprise borate co-initiators; also, halogenated s-triazines are described as further co-initiators.

Further photopolymerizable compositions with initiator systems are described in U.S. Pat. Nos. 5,756,258, 5,545,676, 5,914,215, JP 11-038633, JP 09-034110, U.S. Pat. No. 5,763,134 and EP 0 522 175.

U.S. Pat. No. 6,245,486 discloses radiation sensitive printing plates, including on-press developable plates. However, this patent requires compositions having an IR ablatable mask layer over a UV addressable, negative-working, on press developable, free radical polymerizable layer.

U.S. Pat. No. 6,245,481 discloses IR-ablatable, UV-photopolymerizable two-layer compositions that require IR exposure followed by UV flood irradiation.

U.S. Pat. No. 5,599,650 discloses UV addressable, negative-working, on press developable printing plates based on free radical polymerization. This patent requires a free radical quencher polymer, specifically one containing nitroxide groups, in an overcoat layer to facilitate developability.

U.S. Pat. No. 6,071,675 discloses similar printing plates to U.S. Pat. No. 5,599,650 but additionally requires adding dispersed solid particles to the imaging layer to improve on-press developability or to reduce tackiness.

U.S. Pat. No. 6,309,792 and WO 00/48836 describe IR-sensitive compositions comprising a polymeric binder, a free radically polymerizable system, and a specific initiator system. The compositions of WO 00/48836 require a preheat step after the exposure for sufficient hardening of the compositions. The printing plate precursors must be developed with an aqueous developer.

U.S. patent application Ser. No. 09/832,989 describes IR sensitive compositions containing leuco dyes additional to those described in U.S. Pat. No. 6,309,792 and WO 00/48836. U.S. patent application Ser. No. 09/832,989 requires a preheat step after IR exposure and an aqueous development step for processing.

U.S. Pat. No. 5,204,222 teaches a composition comprising polymerizable ingredients in conjunction with a polymer binder comprising a polyurethane main chain. The side chains of the polymer binder do not comprise a polyethylene oxide chain.

U.S. Pat. No. 5,800,965 teaches a composition, suitable for flexographic plates, comprising monomers of polyethylene glycol as polymerizable components.

U.S. Pat. No. 6,037,102, also directed to flexographic plates, teaches a photopolymerizable composition comprising a graft copolymer having polyvinyl alcohol grafts on a polyethylene oxide (PEO) main chain polymer.

EP 1,117,005 discloses photopolymerizable compounds which contain polyethylene oxide chains having 1–10 ethylene oxide units. The invention is exemplified by the use of polymers having one ethylene oxide unit. With more than ten ethylene oxide units, both resolution and water resistance of cured products decrease. Binder resins having sufficiently long PEO segments in accordance with the present invention are not disclosed.

U.S. Pat. No. 6,582,882 discloses graft copolymers comprising polyethylene oxide side chains, but does not teach a composition comprising polymerizable components or initiators. The side chains may further comprise a hydrophobic segment between the polyetylene oxide segement and the main chain, and a hydrophobic segment at the terminus of the polyethylene oxide side chains.

Co-pending U.S. patent application Ser. No. 10/066,874 discloses polyalkylene ether polymers and copolymers, including block copolymers of polyethylene oxide and polypropylene oxide. However, the polyalkylene ether polymers and copolymers disclosed in this co-pending application do not provide sufficient differentiation for developability of the unexposed areas and durability of the exposed image areas.

None of the above patents or patent applications disclose polymerizable compositions which contain binder resins having PEO segments in accordance with the present invention.

The present invention therefore satisfies the need in the art for a printing plate and process for preparing a printing plate that does not require a preheat step or a development step. As a result of substantial studies, it was found that polymerizable compositions, which contain certain polymeric binders having polyethylene oxide (PEO) segments, are readily developable in aqueous developers, including on-press developability with fountain solution and printing ink. Furthermore, following imagewise exposure to electromagnetic radiation in the ultraviolet, visible or infrared spectral regions, the exposed regions resist developability and serve as durable, ink receptive image areas, without the need for a predevelopment heating step. Thus, it was found that certain polymeric binders having PEO segments, surprisingly, enhance differentiation of the exposed and unexposed areas by facilitating developability of the unexposed areas together with enhancing durability of the exposed image areas.

SUMMARY OF THE INVENTION

It is therefore one object of the present invention to provide a polymerizable composition comprising a polymerizable compound and a polymeric binder comprising polyethylene oxide segments.

Another object of the present invention is to provide an imageable element comprising: (a) a substrate; and (b) a polymerizable composition coated onto the substrate, the composition comprising (i) a polymerizable compound and (ii) a polymeric binder comprising polyethylene oxide segments, wherein the polymeric binder is selected from the group consisting of at least one graft copolymer comprising a main chain polymer and polyethylene oxide side chains, a block copolymer having at least one polyethylene oxide block and at least one non-polyethylene oxide block, and a combination thereof. Preferably, the imageable element may be exposed by one of ultraviolet, visible, and infrared radiation.

It is still another object of this invention to provide a method for preparing an on-press developable negative-working printing plate, the method comprising (a) providing a substrate; (b) applying a negative-working layer comprising a composition onto the substrate, wherein the composition comprises a polymerizable compound and a polymeric binder comprising polyethylene oxide segments; (c) imaging with one of ultraviolet, visible, and infrared radiation; and (d) developing on a press, wherein the method does not comprise a separate development step.

This invention allows the manufacture of on-press developable or water-developable lithographic printing plates imageable by UV exposure frames, infrared laser plate setters, and visible computer-to-plate plate setters. This invention also provides laser addressable, digitally imaged printing plate precursors, which are developable on press, thereby avoiding a separate development step.

DETAILED DESCRIPTION OF THE INVENTION

The polymerizable compound present in the composition of the invention preferably contains a polymerizable group selected from an addition polymerizable ethylenically unsaturated group, a crosslinkable ethylenically unsaturated group, a ring-opening polymerizable group, an azido group, an aryldiazonium salt group, an aryldiazosulfonate group and a combination thereof.

The addition polymerizable ethylenically unsaturated group may be polymerizable by free radical polymerization, cationic polymerization, or a combination thereof. The free radical addition polymerizable ethylenically unsaturated group is preferably selected from the group consisting of a methacrylate group, an acrylate group, and a combination thereof. The cationic addition polymerizable ethylenically unsaturated group is preferably selected from the group consisting of a vinyl ether, a vinyl aromatic compound, including styrene and alkoxy styrene derivatives, and a combination thereof.

The crosslinkable ethylenically unsaturated group is preferably selected from the group consisting of a dimethylmaleimide group, a chalcone group, and a cinnamate group.

The ring-opening polymerizable group is preferably selected from the group consisting of an epoxide, an oxetane, and a combination thereof.

The polymerizable compound of the invention is present in sufficient amount to render the composition insoluble in an aqueous developer after exposure to radiation. The weight ratio of polymerizable compound to polymeric binder ranges from about 5:95 to about 95:5, preferably from about 10:90 to about 90:10, more preferably from about 20:80 to about 80:20, most preferably from about 30:70 to about 70:30.

The polymerizable composition preferably comprises a free radical addition polymerizable composition, including polymerizable ethylenically unsaturated compounds and a photoinitiator system for generating initiating free radicals. The polymerizable composition may further contain a copolymerizable compound comprising at least two thiol groups. Photoinitiating systems, which are active to electromagnetic radiation in the ultraviolet, visible and/or infrared spectral regions, may be used, corresponding to the spectral range of about 300–1400 nm. Such photoinitiator systems include trichloromethyl triazines alone or together with a photosensitizer, for example, as described in U.S. Pat. No. 4,997,745; diaryliodonium salts and a photosensitizer, as described in U.S. Pat. No. 5,546,258; spectral sensitizers for visible light activation, together with trichloromethyltriazines, as described, for example in U.S. Pat. No. 5,599,650; 3-ketocoumarins, for ultraviolet and visible light activation, together with a polycarboxylic acid coinitiator, such as anilino-N,N-diacetic acid, and a secondary coinitiator, such as diaryliodonium salts, titanocenes, haloalkyl triazines, hexaaryl bisimidizoles, borate salts and photooxidants containing a heterocyclic nitrogen atom that is substituted by an alkoxy or acyloxy group, as described in U.S. Pat. No. 5,942,372; a cyanine dye, diaryliodonium salt and a coinitiator having a carboxylic acid group bonded via a methylene group to a N, O or S group, which is directly attached to an aromatic ring, as described in U.S. Pat. No. 5,368,990; a cyanine dye, for infrared radiation activation, together with a trichloromethyltriazine and an organoboron salt, as described in U.S. Pat. No. 5,496,903; an infrared radiation absorber, a compound capable of producing an initiating free radical, including trichloromethyl triazines and azinium compounds and a polycarboxylic acid coinitiator having a carboxylic acid group bonded via a methylene group to a N, O S group, which is directly attached to an aromatic ring, as described in U.S. Pat. No. 6,309,792.

Preferred photoinitiator systems include an ultraviolet, visible or infrared absorber, an electron acceptor capable of producing initiating free radicals, and a coinitiator capable of donating an electron and/or hydrogen atom and/or of forming an initiating free radical. The amount of radiation absorber is the amount required to render the composition insoluble to an aqueous developer after exposure to radiation. Preferably, the concentration of the radiation absorber is in the range to provide a molar absorptivity in the range of about 0.05 to 3 mol $l^{-1}$ $cm^{-1}$, preferably about 0.1 to 1.5 mol $l^{-1}$ $cm^{-1}$, more preferably 0.3 to 1.0 mol $l^{-1}$ $cm^{-1}$.

Preferred IR absorbers for photo/thermal activation are squarilium dyes, croconate dyes, triarylamine dyes, thiazolium dyes, indolium dyes, oxaxolium dyes, cyanine and merocyanine dyes, polyaniline dyes, polypyrrole dyes, polythiophene dyes, chalcogenopyryloarylidene and bis (chalcogenopyrylo)polymethine dyes, oxyindolizine dyes, pyrylium dyes and phthalocyanine pigments. Other useful classes include azulenium and xanthene dyes, as well as carbon blacks, metal carbides, borides, nitrides, carbonitrides and bronze-structured oxides. Cyanine dyes are particularly preferred.

In another embodiment, the polymerizable composition preferably comprises a condensate of an aryldiazonium salt or mixture of aryldiazonium salts with a condensable compound. The condensable compound is preferably selected from the group consisting of aldehydes, bis-methoxymethyl diphenyl ether, and mixtures thereof. The polymerizable composition comprising the condensate of an aryldiazonium salt preferably also comprises a co-reactive binder.

The aryldiazonium condensate polymerizable compositions may further contain a free-radical addition polymerizable composition, including polymerizable ethylenically unsaturated compounds and a photoinitiator system for generating initiating free radicals, as described above. Such compositions are known as diazo photopolymer hybrid compositions.

The polymerizable composition of the invention comprises a polymerizable compound and a polymeric binder comprising polyethylene oxide segments, wherein the polymeric binder is selected from graft copolymers having a main chain polymer and polyethylene oxide (PEO) side chains and block copolymers having PEO together with non-PEO blocks.

Preferably the graft and block copolymers are amphiphilic, which signifies that they comprise both hydrophilic and hydrophobic segments. Such amphiphilic copolymers also tend to be surface active. The PEO segments are hydrophilic. Although not bound by any theory, the combination of hydrophobic and hydrophilic segments is considered to be important for enhancing differentiation of the exposed and unexposed areas.

The glass transition temperature $T_g$ of the polymeric binder used in this invention preferably ranges from about 35 to about 220° C., more preferably from about 45 to about 140° C., most preferably from about 50 to about 130° C. The polymeric binder having $T_g$ values in the range specified above is a solid and is preferably non-elastomeric. The polymeric binders may be crosslinked, but are preferably uncrosslinked. The glass transition temperature $T_g$ of the main chain polymer of the graft copolymer and the non-PEO block of the block copolymer preferably ranges from 40 to about 220° C., more preferably from about 50 to about 140° C., most preferably from about 60 to about 130° C.

Preferably, the graft and block copolymers have number average molecular weights from about 2,000 to about 2,000,000. Preferably the number average molecular weight (Mn) of the PEO segments ranges from about 500 to about 10,000, more preferably from about 600 to about 8,000, most preferably from about 750 to about 4,000. When the Mn values are less than about 500, there is insufficient hydrophilic segment to adequately promote aqueous developability. However, ink receptivity of the image areas tends to decrease with increasing Mn values of the polyethylene oxide segments, which approach 10,000.

The amount of PEO segments in the graft copolymers ranges from about 0.5 to about 60% by weight, preferably about 2 to about 50% by weight, more preferably about 5 to about 40% by weight, most preferably about 5 to about 20% by weight. The amount of PEO segments in the block copolymers ranges from about 5 to about 60% by weight, preferably about 10 to about 50% by weight, more preferably about 10 to about 30% by weight. At the low levels of PEO segments in the graft and block copolymers, developability tend to decrease, whereas at the high levels, ink receptivity of the image areas tends to decrease.

The polymeric binder is present in sufficient amount to render the photopolymerizable composition soluble or dispersible in an aqueous developer. Preferably, the amount of polymeric binder ranges from about 10% to 90% by weight of the composition, more preferably from about 30% to 70% by weight. Aqueous developability tends to increase with increasing level of PEO segments in the polymeric binder. However, at excessively high PEO levels, ink receptivity of the image areas tends to decrease.

Preferably, the graft copolymer has a hydrophobic polymer backbone and a plurality of pendant groups represented by the formula:

wherein Q is a difunctional connecting group; W is selected from the group consisting of a hydrophilic segment and a hydrophobic segment; Y is selected from the group consisting of a hydrophilic segment and a hydrophobic segment; with the proviso that when W is a hydrophilic segment, Y is selected from the group consisting of a hydrophilic segment and a hydrophobic segment; with the further proviso that when W is hydrophobic, Y is a hydrophilic segment.

The term "graft" polymer or copolymer in the context of the present invention refers to a polymer which has as a side chain a group having a molecular weight of at least 200. Such graft copolymers can be obtained, for example, by anionic, cationic, non-ionic, or free radical grafting methods, or they can be obtained by polymerizing or co-polymerizing monomers, which contain such groups. The term "polymer" in the context of the present invention refers to high and low molecular weight polymers, including oligomers, and includes homopolymers and copolymers. The term "copolymer" refers to polymers that are derived from two or more different monomers. The term "backbone" in the context of the present invention refers to the chain of atoms in a polymer to which a plurality of pendant groups are attached. An example of such a backbone is an "all carbon" backbone obtained from the polymerization of an olefinically unsaturated monomer.

The graft copolymer preferably comprises repeating units where each unit is represented by the formula wherein each of $R^1$ and $R^2$ is independently selected from the group consisting of: H, alkyl, aryl, aralkyl, alkaryl, $COOR^5$, $R^6CO$, halogen and cyano;

Q is selected from the group consisting of:

wherein $R^3$ is selected from the group consisting of: H and alkyl; $R^4$ is selected from the group consisting of: H, alkyl, halogen, cyano, nitro, alkoxy, alkoxycarbonyl, acyl and a combination thereof;

W is selected from the group consisting of: a hydrophilic segment and a hydrophobic segment;

Y is selected from the group consisting of: a hydrophilic segment and a hydrophobic segment;

Z is selected from the group consisting of: H, alkyl, halogen, cyano, acyloxy, alkoxy, alkoxycarbonyl, hydroxyalkyloxycarbonyl, acyl, aminocarbonyl, aryl and substituted aryl;

with the proviso that when W is a hydrophilic segment, Y is selected from the group consisting of: a hydrophilic segment and a hydrophobic segment, with the further proviso that when W is hydrophobic, Y is a hydrophilic segment.

In one embodiment, the graft copolymer of the present invention comprises main chain segments that are predominately hydrophobic and branch segments that are predominately hydrophilic.

In a second embodiment, the graft copolymer comprises main chain segments that are predominately hydrophobic and branch segments comprising both hydrophobic and hydrophilic segments.

The hydrophilic segment in W in the graft copolymer of the present invention is preferably a segment represented by the formula:

wherein each of $R^7$, $R^8$, $R^9$ and $R^{10}$ is hydrogen; $R^3$ can be H or alkyl; and n is from about 12 to about 250. The hydrophobic segment in W can be $—R^{12}—$, $—O—R^{12}—O—$, $—R^3N—R^{12}—NR^3—$, $—OOC—R^{12}—O—$ or $—OOC—R^{12}—O—$, wherein each $R^{12}$ can independently be a linear, branched or cyclic alkylene of 6–120 carbon atoms, a haloalkylene of 6–120 carbon atoms, an arylene of 6–120 carbon atoms, an alkarylene of 6–120 carbon atoms or an aralkylene of 6–120 carbon atoms; and $R^3$ can be H or alkyl.

The hydrophilic segment in Y can be H, $R^{15}$, OH, $OR^{16}$, COOH, $COOR^{16}$, $O_2CR^{16}$, a segment represented by the formula:

wherein each of $R^7$, $R^8$, $R^9$ and $R^{10}$ is hydrogen; $R^3$ can be H or alkyl; wherein each $R^{13}$, $R^{14}$, $R^{15}$ and $R^{16}$ can independently be H or alkyl of 1–5 carbon atoms and n is from about 12 to about 250. The hydrophobic segment in Y can be a linear, branched or cyclic alkyl of 6–120 carbon atoms, a haloalkyl of 6–120 carbon atoms, an aryl of 6–120 carbon atoms, an alkaryl of 6–120 carbon atoms, an aralkyl of 6–120 carbon atoms, $OR^{17}$, $COOR^{17}$ or $O_2CR^{17}$, wherein $R^{17}$ is an alkyl of 6–20 carbon atoms.

In a preferred embodiment, the graft copolymer comprises repeating units represented by the formula:

wherein each of $R^1$ and $R^2$ can independently be H, alkyl, aryl, aralkyl, alkaryl, $COOR^5$, $R^6CO$, halogen or cyano;

wherein Q can be one of:

and wherein $R^3$ can be H or alkyl; $R^4$ can independently be H, alkyl, halogen, cyano, nitro, alkoxy, alkoxycarbonyl, acyl or a combination thereof;

W is selected from the group consisting of: a hydrophilic segment and a hydrophobic segment;

Y is selected from the group consisting of: a hydrophilic segment and a hydrophobic segment;

Z is selected from the group consisting of: H, alkyl, halogen, cyano, acyloxy, alkoxy, alkoxycarbonyl, hydroxyalkyloxycarbonyl, acyl, aminocarbonyl, aryl and substituted aryl, where the substituent in the above substituted aryl can be alkyl, halogen, cyano, alkoxy or alkoxycarbonyl, and the alkyl group is preferably an alkyl of 1 to 22 carbon atoms;

with the proviso that when W is a hydrophilic segment, Y is selected from the group consisting of: a hydrophilic segment and a hydrophobic segment, with the further proviso that when W is hydrophobic, Y is a hydrophilic segment.

The segment W can be a hydrophilic segment or a hydrophobic segment, wherein the hydrophilic segment can be a segment represented by the formula:

wherein each of $R^7$, $R^8$, $R^9$ and $R^{10}$ is hydrogen; $R^3$ can be H and alkyl; and n is from about 12 to about 250. The hydrophobic segment can be $-R^{12}-$, $-O-R^{12}-O-$, $-R^3N-R^{12}-NR^3-$, $-OOC-R^{12}-O-$ or $-OOC-R^{12}-O-$, wherein each $R^{12}$ can independently be a linear, branched or cyclic alkylene of 6–120 carbon atoms, a haloalkylene of 6–120 carbon atoms, an arylene of 6–120 carbon atoms, an alkarylene of 6–120 carbon atoms or an aralkylene of 6–120 carbon atoms; $R^3$ can be H or alkyl.

Y can be a hydrophilic segment or a hydrophobic segment, wherein the hydrophilic segment can be H, $R^{15}$, OH, $OR^{16}$, COOH, $COOR^{16}$, $O_2CR^{16}$, a segment represented by the formula:

wherein each of $R^7$, $R^8$, $R^9$ and $R^{10}$ is hydrogen; $R^3$ can be H and alkyl; wherein each $R^{13}$, $R^{14}$, $R^{15}$ and $R^{16}$ can be H or alkyl of 1–5 carbon atoms and n is from about 12 to about 250. The hydrophobic segment in Y can be a linear, branched or cyclic alkyl of 6–120 carbon atoms, a haloalkyl of 6–120 carbon atoms, an aryl of 6–120 carbon atoms, an alkaryl of 6–120 carbon atoms, an aralkyl of 6–120 carbon atoms, $OR^{17}$, $COOR^{17}$ or $O_2CR^{17}$, wherein $R^{17}$ can be an alkyl of 6–20 carbon atoms.

In another preferred embodiment, the segment W—Y can be represented by the formula:

$-(OCH_2CH_2)_n-OCH_3$ wherein n is from about 12 to about 75. In this preferred embodiment, the graft copolymer has, for example, repeating units represented by the formula:

wherein n is from about 12 to about 75. More preferably, n has an average value of about 45.

In another preferred embodiment, the graft copolymer comprises repeating units represented by the formula:

wherein n is from about 12 to about 75, more preferably, n has an average value of about 45.

In one preferred embodiment, the main chain polymer of the graft copolymer of the invention comprises monomer units which are selected from the group consisting of acrylate esters, methacrylate esters, styrene, acrylic acid, methacrylic acid, and combinations thereof. More preferably, the monomer units are methyl methacrylate, allyl methacrylate, or combinations thereof.

The graft copolymer having hydrophobic and/or hydrophilic segments may be prepared by a process comprising the steps of:

(A) contacting the following components to produce a polymerizable graft copolymer:

(i) a compound represented by the formula:

wherein W is selected from the group consisting of: a hydrophilic segment and a hydrophobic segment and Y is selected from the group consisting of: a hydrophilic segment and a hydrophobic segment, with the proviso that when W is a hydrophilic segment, Y is selected from the group consisting of: a hydrophilic segment and a hydrophobic segment, with the further proviso that when W is hydrophobic, Y is a hydrophilic segment, and (ii) a polymerizable monomer selected from the group consisting of compounds represented by the formula:

wherein each $R^1$ is independently selected from the group consisting of: H, alkyl, aryl, aralkyl, alkaryl, $COOR^5$, $R^6CO$, halogen and cyano; $R^4$ is selected from the group consisting of: H, alkyl, halogen, cyano, nitro, alkoxy, alkoxycarbonyl, acyl and a combination thereof; and X is glycidyloxy or a leaving group selected from the group consisting of: halogen, alkoxy or aryloxy, to produce a polymerizable graft monomer; and (B) copolymerizing the polymerizable graft monomer and one or more comonomers at a temperature and for a period of time sufficient to produce the graft copolymer. When necessary, the contacting step takes place in the presence of a catalyst.

Preferably, the comonomer is one or more of the following: styrene, substituted styrene, alpha-methylstyrene, acrylate ester, methacrylate ester, acrylonitrile, acrylamide, methacrylamide, vinyl halide, vinyl ester, vinyl ether and an alpha-olefin.

The preferred polymerizable monomer can be any monomer that is capable of reacting with H—W—Y and include polymerizable monomers, such as, m-isopropenyl-α,α-dimethylbenzyl isocyanate, acryloyl chloride and methacryloyl chloride. The reaction is typically carried out in the presence of a catalyst, which is preferably a base, a tin compound or a mixture thereof. In a reaction that admits to an acid catalyst, an acid catalyst such as a Lewis or protic acid may be used.

Preferably, the compounds represented by the formula H—W—Y can be one or more of compounds represented by the formula:

wherein each of $R^7$, $R^8$, $R^9$ and $R^{10}$ is hydrogen; $R^3$ can be H or alkyl; Y can be alkyl, acyloxy, alkoxy or carboxylate; and n is from about 12 to about 250.

The graft copolymer is typically obtained by a free-radical copolymerization of the graft monomer and the comonomer, preferably at a comonomer to graft monomer weight ratio of from about 99:1 to about 45:55.

Alternatively, the graft copolymer can be prepared by first copolymerizing a polymerizable monomer according to the present invention with one or more comonomers at a temperature and for a period of time sufficient to produce a graftable copolymer and thereafter grafting the group —W—Y onto the graftable copolymer. Such grafting can be achieved by contacting in the presence of a catalyst the above graftable copolymer and a compound represented by the formula:

wherein W can be a hydrophilic segment or a hydrophobic segment and Y can be a hydrophilic segment and a hydrophobic segment, with the proviso that when W is a hydrophilic segment, Y is either a hydrophilic segment or a hydrophobic segment, with the further proviso that when W is hydrophobic, Y is a hydrophilic segment.

The graft copolymers of the present invention may be prepared by reacting hydroxy-functional or amine functional polyethylene glycol monoalkyl ethers with polymers having co-reactive groups, including acid chloride, isocyanate and anhydride groups. The side chains may further comprise a hydrophobic segment between the PEO segment and the main chain, and a hydrophobic segment at the terminus of the PEO side chains. Other methods of preparation of the graft copolymers of the present invention include the methods described in U.S. patent application Ser. No. 09/826,300, herein incorporated by reference.

The main chain polymer of the graft copolymers may be an addition polymer or a condensation polymer. Addition polymers are preferably prepared from acrylate and methacrylate esters, acrylic and methacrylic acid, acrylamides and methacrylamides, acrylonitrile and methacrylonitrile, styrene, vinyl phenol and combinations thereof. More preferably, addition polymers are prepared from styrene, methylmethacrylate, allyl acrylate and methacrylate, acrylic and methacrylic acid, and combinations thereof. Preferably condensation polymers are polyurethanes, epoxy resins, polyesters, polyamides and phenolic polymers, including phenol/formaldehyde and pyrogallol/acetone polymers.

The polymeric binder may also comprise a mixture of graft copolymers each comprising a main chain polymer and polyethylene oxide side chains. The main chain polymer of each graft copolymer is independently selected from an addition polymer and a condensation polymer. Preferable addition polymers are homopolymers and copolymers of monomers independently selected from the group consisting of acrylate and methacrylate esters, including allyl acrylate and methacrylate, acrylic and methacrylic acid, acrylamides and methacrylamides, acrylonitriles and methacrylonitriles, styrene, vinyl phenol and combinations thereof. Preferable condensation polymers are independently selected from polyurethanes, epoxy resins, polyesters, polyamides and phenolic polymers, including phenol/formaldehyde and pyrogallol/acetone condensation polymers.

The block copolymers of the present invention can be made by conventional procedures, including anionic, cationic, and free radical polymerization. Atom transfer radical polymerization (ATRP) and reversible addition-fragmentation chain transfer (RAFT) polymerization can be particularly convenient methods. PEO block copolymers are conveniently prepared by ATRP methods, as described by M. Ranger, et al., "From well-defined diblock copolymers prepared by a versatile atom transfer radical polymerization method to supramolecular assemblies," Journal of Polymer Science, Part A: Polymer Chemistry, Vol. 39 (2001), pp. 3861–74.

The at least one non-polyethylene oxide block of the block copolymers may be an addition polymer or a condensation polymer. The addition polymers are preferably homopolymers or copolymers of monomers selected from acrylate and methacrylate esters, including allyl acrylate and methacrylate, acrylic and methacrylic acid, acrylamides and methacrylamides, acrylonitrile and methacrylonitrile, styrene, and vinyl phenol. Preferable condensation polymers are polyurethanes, epoxy resins, polyesters, polyamides and polyureas.

In one preferred embodiment of the invention, the at least one non-polyethylene oxide block of the block copolymers does not comprise polyalkylene oxide segments. In another preferred embodiment, the at least one non-polyethylene oxide block comprises homopolymers or copolymers of monomers selected from the group consisting of methyl methacrylate, allyl acrylate and methacrylate, acrylic and methacrylic acid, styrene, vinyl phenol and combinations thereof.

The polymeric binder may comprise a mixture of block copolymers each comprising at least one PEO block and at least one non-PEO block, as described above. In addition, the polymeric binder may comprise a mixture of graft and block copolymers, as described above.

In another embodiment of the invention, the polymerizable composition comprises discrete particles. The particles may include a mixture of copolymers, which contain various possible combinations of monomeric units. Preferably, the discrete particles are particles of the polymeric binder which are suspended in the polymerizable composition. In a particularly preferred embodiment, the polymeric binder comprises at least one graft copolymer. The diameter of the particles in the suspension may range between about 60 nm and about 300 nm in diameter. The presence of such discrete particles tends to promote developability of the unexposed areas.

The substrate of the imageable element is typically an aluminum sheet. However, other materials that are commonly known to those skilled in the art can also be used. Suitable substrates include any sheet material conventionally used to prepare lithographic printing plates, including metals such as aluminum sheets; paper; paper coated on one or both sides with an .alpha.-olefin polymer such as polyethylene; films such as cellulose acetate film, polyvinyl acetal film, polystyrene film polypropylene film, polyester film such as polyethylene terephthalate film, polyamide film, polyimide film, nitrocellulose film, polycarbonate film, polyvinylchloride film; composite films such as polyester, polypropylene or polystyrene film coated with polyethylene film; metallized paper or films; metal/paper laminates and the like.

The surface of plastic films may be treated using the surface treatment techniques known in the art to improve adhesion between the substrate and organic coatings.

A preferred substrate is an aluminum sheet. The surface of the aluminum sheet may be treated with metal finishing techniques known in the art including physical roughening, electrochemical roughening, chemical roughening, anodizing, and silicate sealing and the like. If the surface is roughened, the average roughness (Ra) is preferably in the range from 0.1 to 0.8 $\mu$m, and more preferably in the range from about 0.1 to about 0.4 $\mu$m. The preferred thickness of the aluminum sheet is in the range from about 0.005 inch to about 0.020 inch. The preferred substrate is electrochemically-grained and anodized aluminum, such as commonly used for lithographic printing plates.

Anodic pore size for sulfuric acid anodization is typically less than 20 nm whereas anodic pore size for phosphoric acid anodization is typically greater than 30 nm. The use of large anodic pore size substrates that are phosphoric acid anodized is preferred over sulfuric acid-anodized substrates. Other conventional anodization methods can also be used in the preparation of the anodized substrate of the present invention, including particularly those that produce an anodic pore size larger than anodic pore size produced by sulfuric acid anodization.

The polymeric binder can be applied onto the substrate as a solution or dispersion in the coating liquid of the image-forming layer by a suitable coating method. Illustrative of such a method is dissolving the graft copolymer in an organic water immiscible solvent, dispersing the resulting solution in an aqueous medium, applying the resulting dispersion onto a substrate and thereafter removing the solvent by evaporation. After proper drying, the coating weight of the layer is preferably in the range of about 0.2 to about 5.0 g/m$^2$, and more preferably in the range from about 0.7 to about 2.5 g/m$^2$.

Preferably, imaging is carried out using an infrared laser and a radiation absorber for absorbing IR radiation. However, UV and visible laser imaging may also be used together with an appropriate radiation absorber. Accordingly, the imageable composition of the present invention can further comprise a radiation absorber, which may serve as a sensitizer for promoting polymerization or as a material that is capable of converting electromagnetic radiation into heat.

The imageable element may further comprise an overlying layer. One possible function of the overlying layer is to serve as an oxygen barrier layer by comprising an oxygen-impermeable compound. The term "oxygen-impermeable compound" is intended to mean a compound that prevents the diffusion of oxygen from the atmosphere into the layer during the lifetime of the radicals generated by IR exposure. The overlying layer should be soluble, dispersible or at least permeable to the developer. Other possible functions of an overlying layer include:

(1) to prevent damage, such as scratching, of the surface layer during handling prior to imagewise exposure;
(2) to prevent damage to the surface of the imagewise exposed areas, for example, by over-exposure which could result in partial ablation; and
(3) to facilitate developability of the unexposed areas.

Preferably, the imagewise exposure step of the method of the invention is performed with radiation in the range of about 300 to about 1400 nm, preferably about 350 to about 900 nm.

Preferably, development with aqueous developer does not involve a separate development step. The printing plate may be directly mounted on press, wherein the non-exposed areas are removed by fountain solution and/or ink, thereby avoiding a separate development step. It is noted that plates designed for on-press development can also be developed with a conventional process using a suitable aqueous developer. The plates disclosed in this invention include on-press developable plates as well as plates which are intended for other development processes.

The aqueous developer composition is dependent on the nature of the graft copolymer composition. Common components of aqueous developers include surfactants, chelating agents, such as salts of ethylenediamine tetraacetic acid, organic solvents, such as benzyl alcohol, and alkaline components, such as, inorganic metasilicates, organic metasilicates, hydroxides and bicarbonates. The pH of the aqueous developer is preferably within about 5 to about 14, depending on the nature of the graft copolymer composition.

Following development, a postbake may optionally be used to increase press life.

In addition to the thermally imageable layer, the thermally imageable element can have additional layers, such as an underlying layer. Possible functions of an underlying layer include:

(1) to enhance developability of the imagewise unexposed areas; and (2) to act as a thermal insulating layer for the imagewise exposed areas.

Such a thermal insulating polymeric layer prevents otherwise rapid heat dissipation, for example, through the heat conducting aluminum substrate. This allows more efficient thermal imaging throughout the thermally imageable layer, particularly in the lower sections. In accordance with these functions, the underlying layer should be soluble or at least dispersible in the developer and, preferably, have a relatively low thermal conductivity coefficient.

The invention is further described in the following examples, which are intended to be illustrative and not limiting.

EXAMPLE 1
Synthesis of Macromer 1

Macromer-1

Toluene (266 g) was charged into a 500-mL flask, followed by the addition of poly (ethyleneglycol monomethyl ether) (80 g) (Mn 2000) and methacryloyl chloride (4.2 g) in a $N_2$ atmosphere. Subsequently, triethylamine (4.52 g) was added over a period of 20 minutes, while maintaining the reaction temperature at 30° C. After an additional 2 hr, the temperature of the reaction mixture was raised to 50° C. and kept at that temperature for an additional 2 hr. Subsequently, the reaction mixture was cooled to room temperature and filtered to remove the triethylamine hydrochloride salt, which was obtained in the theoretical amount. Petroleum ether was added to the filtrate to precipitate Macromer 1, which was collected by filtration and dried in vacuum oven at room temperature. The reaction is shown in the scheme above. Preferably, average value of n is about 45.

EXAMPLE 2
Synthesis of Graft Copolymer 1

Macromer 1 (7.5 g), water (48 g) and 1-propanol (192 g) were charged into a 500-mL flask, which was heated to 80° C. Styrene (66.9 g) and azo bis-isobutyronitrile (0.48 g) (Vazo-64, from DuPont de Nemours Co) were mixed in a separate beaker and part of this solution (12 g) was added to the macromer solution, which became hazy within about 10 minutes. Subsequently, the remaining solution was added over a 30-min period. After 3 additional hours, the conversion to Graft Copolymer 1 was about 97% based on determination of percent non-volatiles. The weight ratio of styrene:Macromer 1 was about 90:10 in graft copolymer 1.

EXAMPLE 3
Preparation of On-press Developable Printing Plate

On a brush-grained and phosphoric acid anodized aluminum substrate that has been subbed by polyacrylic acid, the solution described in Table 1 was applied to give a dry coating weight of 2 g/m².

TABLE 1

Composition of Example 3 (formulations in parts by weight)

| Component | Parts by Weight Percent |
| --- | --- |
| Reaction product of DESMODUR ® N100 with hydroxyethyl acrylate and pentaerythritol triacrylate | 3.74 |
| Graft copolymer 1 | 3.53 |
| Sartomer 355[1] | 0.78 |
| 2-(4-methoxyphenyl)-4,6-bis(trichloromethyl)-2-triazine | 0.42 |
| Anilino-N,N-diacetic acid | 0.23 |
| IR dye[2] | 0.09 |
| Byk 307[3] | 0.02 |
| n-Propanol | 72.95 |
| Water | 18.24 |

[1]Sartomer 355 is a multifunctional acrylic monomer available from Sartomer Co., Inc.
[2]The IR dye is 2-[2-[2-phenylthio-3-[(1,3-dihydro-1,3,3-trimethyl-2H-indol-2-ylidene)ethylidene]-1-cyclohexen-1-yl]ethenyl]-1,3,3-trimethyl-3H-indolium chloride.
[3]Byk 307 is a modified polysiloxane available from Byk Chemie.

The resulting coating was then over-coated with a solution of polyvinyl alcohol (5.26 parts) and polyvinylimidazole (0.93 parts) in isopropanol (3.94 parts) and water (89.87 parts) to give a dry coating weight of 2 g/m². The resulting plate was imaged on a Creo Trendsetter 3244x at 250 mJ/cm² and then mounted directly on an AB Dick press. The plate printed more than 500 copies of good quality prints. A second plate was imaged with an Olec vacuum frame (5 kW bulb) for 12 units at medium intensity. The plate was mounted on an AB Dick press and more than 500 good quality copies resulted.

EXAMPLE 4
Preparation of UV Sensitive On-press Developable Printing Plate

Example 3 was repeated except IR dye was removed and no over-coat was applied. The resulting plate was imaged with an Olec vacuum frame (5 kW bulb) for 6 units at medium intensity. The plate was mounted on an AB Dick press and more than 300 good quality copies resulted.

EXAMPLE 5
Preparation of Visible Light Sensitive On-press Developable Printing Plate

On a brush-grained and phosphoric acid anodized aluminum substrate that has been subbed by polyacrylic acid, the solution described in Table 2 was applied to give a dry coating weight of 1.3 g/m².

TABLE 2

Composition of Example 5 (formulation in parts by weight)

| Component | Parts by Weight Percent |
|---|---|
| Reaction product of DESMODUR ® N100 with hydroxyethyl acrylate and pentaerythritol triacrylate | 2.44 |
| Graft copolymer 1 | 2.22 |
| Sartomer 355[1] | 0.51 |
| Diphenyliodonium chloride[2] | 0.29 |
| Anilino-N,N-diacetic acid | 0.23 |
| Ketocoumarin 93[4] | 0.06 |
| Byk 307[3] | 0.02 |
| n-Propanol | 75.38 |
| Water | 18.85 |

[1]Sartomer 355 is a multifunctional acrylic monomer available from Sartomer Co., Inc.
[2]Diphenyliodonium chloride from Aldrich.
[3]Byk 307 is a modified polysiloxane available from Byk Chemie.
[4]Ketocoumarin 93 has the following structure:

The resulting coating was then over-coated as described in Example 3 to give a dry coating weight of 2 g/m². The resulting plate was imaged on an Oriel 1000 W Solar Simulator model #81291 (Oriel Instruments, Stratford, Conn.) fitted with a 530 µm filter for 5 sec at 4 mW/cm².

The plate was processed in a sink with water and a solution of 30% Varn 142W/30% Varn Par, then mounted directly on an AB Dick press. The plate printed more than 500 copies of good quality prints.

EXAMPLE 6
Synthesis of Graft Copolymer 2

Deionized water (314.8 g) and sodium dodecyl sulfate (2.0 g) were charged in one-liter 4-neck flask under nitrogen atmosphere and heated to 70° C. A pre-mixture of ammonium persulfate (0.65 g) and deionized water (20 g) were added at 70° C. in 15 minutes. A pre-mixture of styrene (79.5 g), Macromer 1 (10 g) and acrylic acid (7.9 g) were added in 3 hours at 70° C. One-and half-hour later, the % non-volatiles were found to be 22.5% versus 23% (theoretical). The reaction mixture was cooled to room temperature with water. An ammonium hydroxide solution (8 g) was added at room temperature to stabilize the latex.

EXAMPLE 7
Preparation of IR Sensitive Printing Plate

Example 3 was repeated except that no over-coat was applied and Graft Copolymer 1 was replaced by Graft Copolymer 2 to illustrate the effect of binder acid number.

Figure 1:
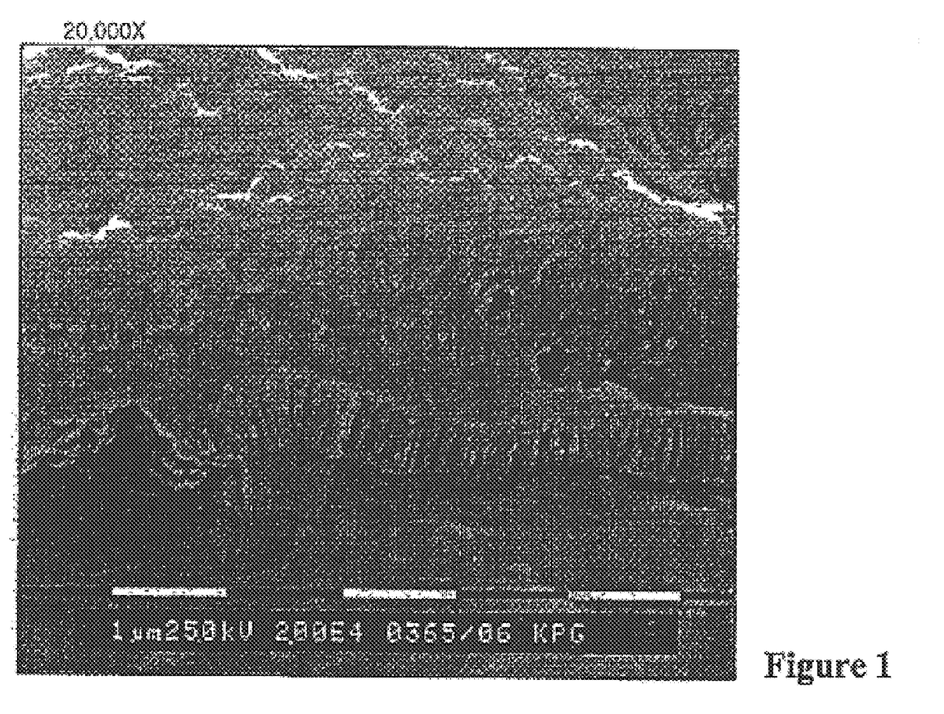
FIG. 1 shows scanning an electron microscope ('SEM') image of the coating of Example 7 discussed herein.

FIG. 1 shows a scanning electron microscope ('SEM') analysis of the resulting coating. As shown in FIG. 1, the coating comprises discrete particles. The diameter of the particles is up to about 60 nm.

The resulting plate was imaged on a Creo Trendsetter 3244x at 496 mJ/cm² and then mounted on a Komori press. The plate was then treated with Prisco liquid plate cleaner. The plate printed more than 27,500 copies of good quality prints.

EXAMPLE 8
Synthesis of Graft Copolymer 3

Macromer 1 (7.5 g), water (48 g) and 1-propanol (192 g) were charged into a 500-mL flask, which was heated to 80° C. Allyl methacrylate (66.9 g) and Vazo-64 (0.48 g) were added slowly. Within ten minutes of the addition of this monomer, gelation of the reaction mixture occurred. Therefore, the reaction mixture was discarded and the procedure was modified as follows below.

2-Butanone (384.1 g) and Macromer 1 (4.25 g) were charged in one-liter 4-neck flask under nitrogen atmosphere and heated to 80° C. A pre-mixture of allyl methacrylate (38.0 g) and Vazo-64 (0.3 g) were added at 80° C. in 90 minutes. After the addition was complete, an additional 0.13 gram of Vazo-64 was added. Thereafter two additional doses of Vazo-64 of 0.13 gram each were added. The polymer conversion based on % non-volatiles was 90%. The weight ratio of allyl methacrylate:Macromer 1 was about 90:10 in Graft Copolymer 3.

The resin solution was precipitated in powder form using hexane (1200 g) and stirred at 3000 RPM using a high shear mixer for 15 to 20 minutes. Then the solution was filtered and the product dried at room temperature.

EXAMPLE 9
Preparation of IR Sensitive On-press Developable Printing Plate

Figure 2:
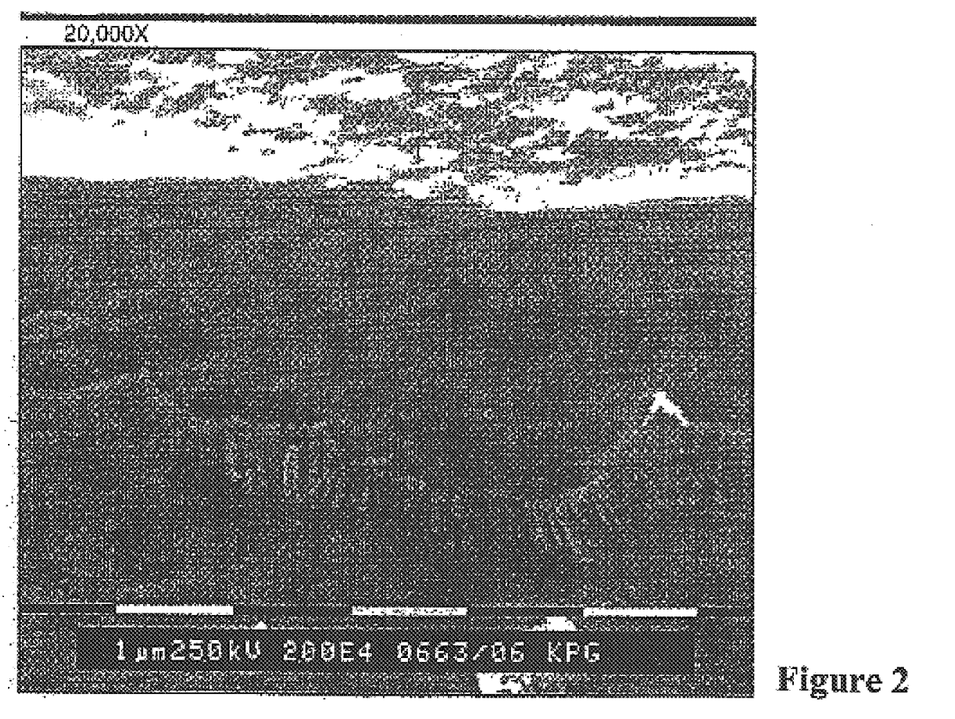
FIG. 2 shows scanning an electron microscope ('SEM') image of the coating of Example 9 discussed herein.

Example 3 was repeated except that the Graft Copolymer 1 was replaced by Graft Copolymer 3 and no over-coat was applied. FIG. 2 shows an SEM analysis of the resulting coating. As shown in FIG. 2, the coating does not comprise discrete particles.

The resulting plate was imaged on a Creo Trendsetter 3244x at 496 mJ/cm² and then mounted directly on an AB Dick press. The plate printed more than 1000 copies of good quality prints.

Another plate, prepared accordingly, and imaged on the Creo Trendsetter at 361 mJ/cm², was mounted on a Komori press fitted with a hard blanket and using Equinox ink. The plate printed more than 40,000 copies of good quality prints.

EXAMPLE 10
Preparation of IR Sensitive On-press Developable Printing Plate

Example 3 was repeated except that the brush grain substrate was replaced by an electrochemically grained substrate with the anodic oxide layer sealed by polyvinyl phosphonic acid.

The resulting plate was imaged on a Creo Trendsetter 3244x at 250 mJ/cm² and then mounted directly on an AB Dick press. The plate printed more than 500 copies of good quality prints.

EXAMPLE 11
Synthesis of Graft Copolymer 4

Macromer 1 (20 g of a 50% aqueous solution),obtained from Aldrich and used as received, water (50 g) and 1-propanol (240 g) were charged into a 1000-mL flask, which was heated to 80° C. Methyl methacrylate (89.4 g) and Vazo-64 (0.65 g) were mixed in a separate beaker and part of this solution (12 g) was added to the macromer solution, which became hazy within about 10 minutes. Subsequently, the remaining solution was added over a 90-min period. After 3 additional hours, the conversion to Graft Copolymer 4 was about 97% based on determination of percent non-volatiles. The weight ratio of methyl methacrylate:Macromer 1 was about 90:10 in Graft Copolymer 4.

In an alternative procedure, a solution of Macromer 1 (7.5 g), dissolved in a mixture of water (48 g) and 1-propanol (192 g) was charged into a 500-mL flask, which was heated to 80° C. Methyl methacrylate (66.9 g) and Vazo-64 (0.48 g) were mixed in a separate beaker and part of this solution (12 g) was added to the macromer solution, which became hazy within about 10 minutes. Subsequently, the remaining solution was added over a 30-min period. After 3 additional hours, the conversion to Graft Copolymer 4 was about 97% based on determination of percent non-volatiles. The weight ratio of methyl methacrylate:Macromer 1 was about 90:10 in Graft Copolymer.

EXAMPLE 12
Preparation of IR Sensitive Printing Plate

Figure 3:
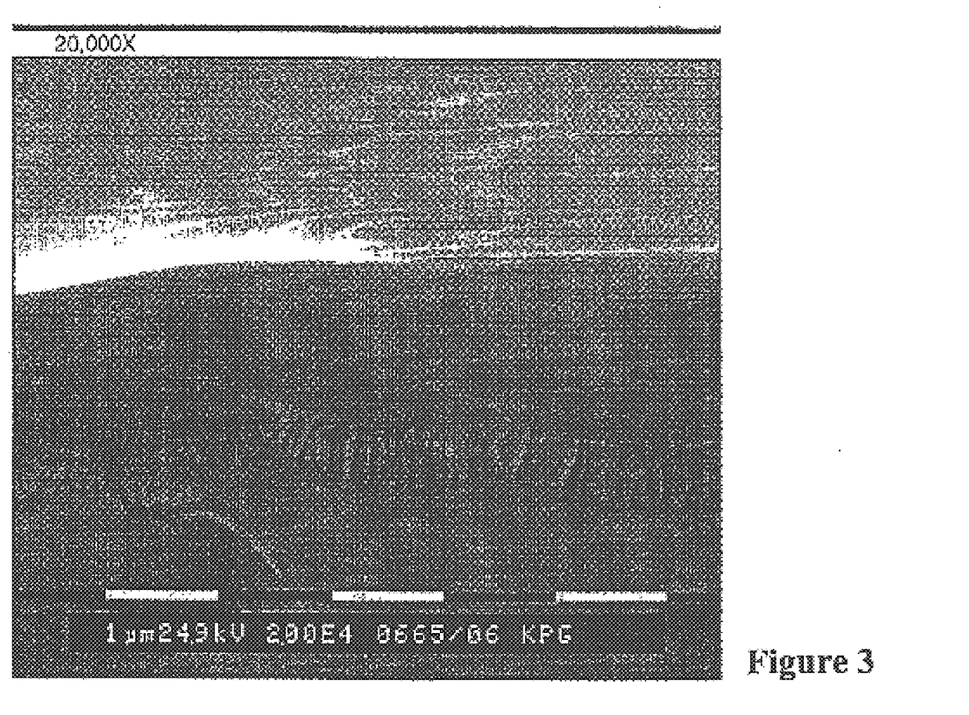
FIG. 3 shows scanning an electron microscope ('SEM') image of the coating of Example 12 discussed herein.

Example 3 was repeated except that the Graft Copolymer 1 was replaced by Graft Copolymer 4, prepared from Macromer 1 obtained from Aldrich. FIG. 3 shows an SEM analysis of the resulting coating. As shown in FIG. 3, the coating does not comprise discrete particles.

The resulting plate was imaged on a Creo Trendsetter 3244× at 100 mJ/cm$^2$ and then mounted directly on an AB Dick press. However, the use of Graft Copolymer 4 by itself did not provide sufficient differentiation for developability of the unexposed areas and durability of the exposed image areas.

EXAMPLE 13
Synthesis of Graft Copolymer 5

Macromer 1 (7.0 g), deionized water (60 g) and n-propanol (240 g) were charged in a 1-liter flask and heated to 83° C. In a separate beaker, styrene (92.4 g) and Vazo-64 (0.65 g) were mixed together. Part of this mixture (12 g) was added and 30 minutes later the remaining solution was added in two hours. After 3 additional hours, the conversion to Graft Copolymer 5 was about 97% based on determination of percent non-volatiles. The weight ratio of styrene:Macromer 1 was 93:7.

EXAMPLE 14
Preparation of IR Sensitive On-press Developable Printing Plate

Example 3 was repeated except that the graft copolymer 1 was replaced by Graft Copolymer 5 and no over-coat was applied.

The resulting plate was imaged on a Creo Trendsetter 3244× at 250 mJ/cm$^2$ and then mounted directly on an AB Dick press. The plate printed more than 400 copies of good quality prints.

EXAMPLE 15
Synthesis of Macromer 2

Toluene (25 g) was charged into a 500 mL flask, equipped with a Dean Stark trap filled with toluene, followed by the addition of poly ethylene glycol, monomethyl ether (PEGME) (225 g), Mn 2000, in a N$_2$ atmosphere. The reaction mixture was heated to 110° C. and held at this temperature for 2 hr to remove any water by azeotropic distillation. Subsequently, the mixture was cooled to 70° C. and dibutyl tin dilaurate (0.225 g) was added, followed by the addition of m-isopropenyl-α, α-dimethylbenzyl isocyanate (23.6 g) (m-TMI, from Cytec Industries, West Patterson, N.J.) over a 30 min period at 70° C. After an additional 2 hr at 70° C., the reaction was completed, as evidenced by the disappearance of the NCO group, as determined by titration and FT-IR analysis. Subsequently, the solution was poured into a glass tray, resulting in a waxy solid material after 1 day. This material was dissolved in methyl ethyl ketone (300 g), followed by the addition of petroleum ether (2000 g), which resulted in the precipitation of solid Macromer 2, which was collected by filtration and dried in vacuum oven at room temperature.

EXAMPLE 16
Synthesis of Graft Copolymer 6

Macromer 2 (7.5 g), water (48 g) and 1-propanol (192 g) were charged into a 500-mL flask, which was heated to 80° C. Styrene (66.9 g) and Vazo-64 (0.48 g) were mixed in a separate beaker and part of this solution (12 g) was added to the macromer solution, which became hazy within about 10 minutes. Subsequently, the remaining solution was added over a 30-min period. After 3 additional hr, the conversion to graft copolymer 6 was about 97% based on determination of % non-volatiles. The weight ratio of styrene:Macromer 2 was about 90:10 in Graft Copolymer 6.

EXAMPLE 17
Preparation of IR Sensitive On-press Developable Printing Plate

Example 3 was repeated except that the Graft Copolymer 1 was replaced by Graft Copolymer 6.

The resulting plate was imaged on a Creo Trendsetter 3244× at 100 mJ/cm$^2$ and then mounted directly on an AB Dick press. The plate printed more than 500 copies of good quality prints.

Figure 4:
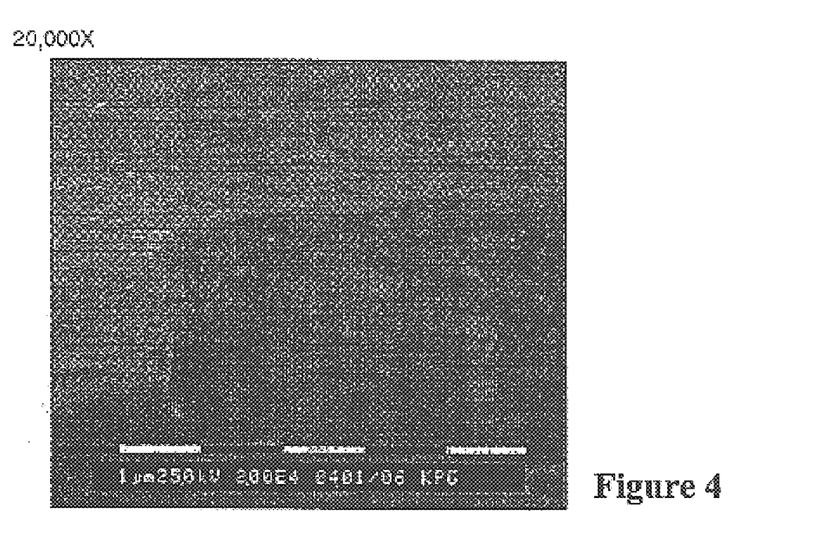
FIG. 4 shows scanning an electron microscope ('SEM') image of the coating of Example 18 discussed herein.

EXAMPLE 18
Preparation of IR Sensitive On-press Developable Printing Plate Without Over-coat Example 3 was repeated except that the over-coat was not applied. FIG. 4 shows an SEM analysis of the resulting coating. As shown in FIG. 4, the coating comprises discrete particles. The diameter of the particles is up to about 100–200 nm.

The resulting plate was imaged on a Creo Trendsetter 3244× at 250 mJ/cm$^2$ and then mounted directly on an AB Dick press. The plate printed more than 600 copies of good quality prints.

EXAMPLE 19
Preparation of On-press Developable Printing Plate

Figure 5:
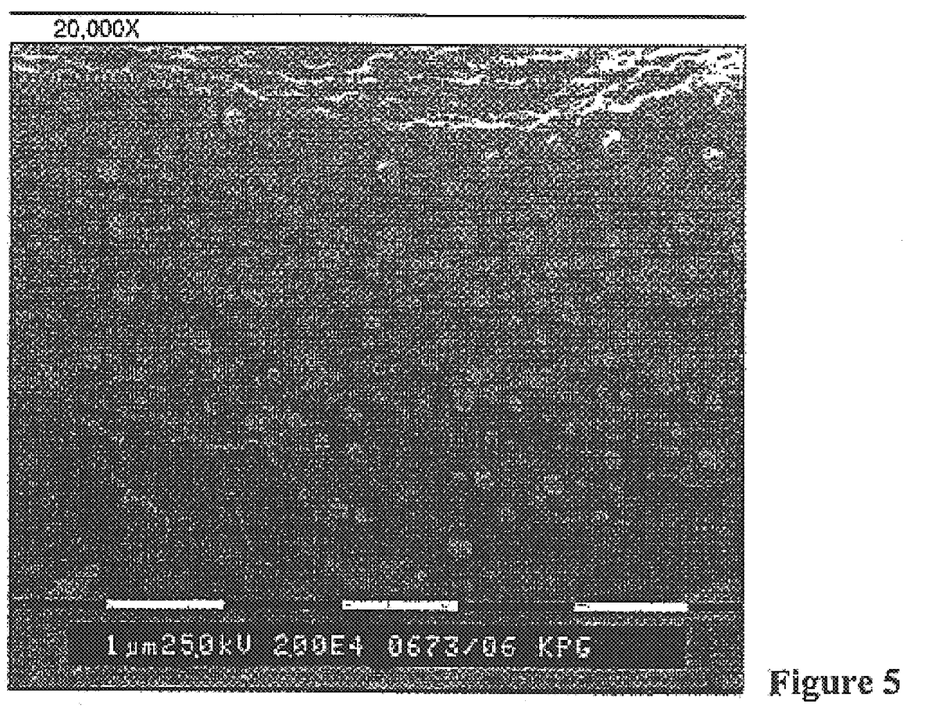
FIG. 5 shows scanning an electron microscope ('SEM') image of the coating of Example 19 discussed herein.

Example 7 was repeated except that Graft Copolymer 2 was replaced by a combination of graft copolymer 1 (3.35 parts by weight) and Graft Copolymer 2 (0.18 parts by weight). FIG. 5 shows an SEM analysis of the resulting coating. As shown in FIG. 5, the coating comprises discrete particles. The diameter of the particles is up to about 100–200 nm.

The resulting plate was imaged on a Creo Trendsetter 3244× at 496 mJ/cm$^2$ and then mounted on an AB Dick press. The plate printed more than 1,000 copies of good quality prints.

Another plate, prepared and imaged accordingly, was mounted on a Komori press fitted with a hard blanket and using Equinox ink. The plate printed more than 30,000 copies of good quality prints.

COMPARATIVE EXAMPLE 1
Preparation of IR Sensitive On-press Developable Printing Plate Without Free-radical Generator Example 18 was repeated except that 2-(4-methoxyphenyl)-4,6-bis(trichloromethyl)-2-triazine in the photopolymerizable coat was omitted.

The resulting plate was imaged on a Creo Trendsetter 3244× at 250 mJ/cm$^2$ and then mounted directly on an AB Dick press. The coating washed off entirely and no prints resulted as there was no image on the plate.

Although the present invention has been described in connection with specific exemplary embodiments, it should be understood that various changes, substitutions and alterations can be made to the disclosed embodiments without departing from the spirit and scope of the invention as set forth in the appended claims.

We claim:

1. An imageable element comprising:
   a substrate; and
   a polymerizable composition coated onto the substrate, the polymerizable composition comprising a polymerizable compound and between about 10 and about 90 weight percent of a polymeric binder;
   wherein the polymeric binder is selected from the group consisting of at least one graft copolymer comprising a main chain polymer and polyethylene oxide side chains, a block copolymer having at least one polyethylene oxide block and at least one non-polyethylene oxide block, and a combination thereof;
   and wherein the polymerizable composition comprises discrete articles of the aft or block copolymer.

2. The imageable element of claim 1, wherein the discrete particles are characterized by a diameter in the range from about 60 nm to about 300 nm.

3. The imageable element of claim 1, wherein the polyethylene oxide segments of the polyethylene oxide side chains or polyethylene oxide block have a number average molecular weight ranging from about 500 to about 10,000.

4. The imageable element of claim 1, wherein the polymeric binder is a graft copolymer and the polyethylene oxide segments of the polyethylene oxide side chains are present in an amount ranging from about 0.5 to about 60% by weight.

5. The imageable element of claim 1, wherein the non-polyethylene oxide block of the block copolymer is free of polyalkylene oxide segments.

6. The imageable element of claim 1, wherein the polymeric binder comprises at least one graft copolymer comprising a main chain polymer and polyethylene oxide side chains.

7. The imageable element of claim 1, wherein the polymeric binder comprises a mixture of at least two copolymers independently comprising a graft copolymer comprising a main chain polymer and polyethylene oxide side chains or a block copolymer having at least one polyethylene oxide block and at least one non-polyethylene oxide block.

8. The imageable element of claim 7, wherein the polymeric binder comprises a mixture of graft copolymers each comprising a main chain polymer and polyethylene oxide side chains.

9. The imageable element of claim 7, wherein the mixture of copolymers comprises at least one graft copolymer not in the form of discrete particles.

10. The imageable element of claim 1, wherein the polymeric binder is a block copolymer, and the polyethylene oxide segments of the block copolymer are present in an amount ranging from about 5 to about 60% by weight.

11. The imageable element of claim 1, wherein the imageable element is sensitive to ultraviolet, visible, or infrared radiation.

12. The imageable element of claim 1, wherein the polymerizable compound comprises an addition polymerizable ethylenically unsaturated group, a crosslinkable ethylenically unsaturated group, a ring-opening polymerizable group, an azido group, an aryldiazonium salt group, an aryldiazosulfonate group or a combination thereof.

13. The imageable element of claim 12, wherein the addition polymerizable ethylenically unsaturated group is polymerizable by free radical polymerization, cationic polymerization, or a combination thereof.

14. The imageable element of claim 12, wherein the crosslinkable ethylenically unsaturated group is selected from the group consisting of a dimethylmaleimide group, a chalcone group, and a cinnamate group.

15. The imageable element of claim 12, wherein the ring-opening polymerizable group is selected from the group consisting of an epoxide, an oxetane and a combination thereof.

16. The imageable element of claim 1, wherein the weight ratio of polymerizable compound to polymeric binder ranges from about 5:95 to about 95:5.

17. The imageable element of claim 1, wherein the polymerizable composition further comprises a radiation absorber adapted to absorb electromagnetic radiation in the range of about 300 to about 1400 nm.

18. The imageable element of claim 17, wherein the radiation absorber is an infrared radiation absorber.

19. The imageable element of claim 1, wherein the polymerizable composition further comprises a free radical initiator system comprising an electron acceptor and a coinitiator capable of donating electrons, donating hydrogen atoms, or forming a hydrocarbon radical.

20. The imageable element of claim 1, wherein the imageable element is a printing plate precursor.

21. The imageable element of claim 20, wherein the printing plate precursor is adapted to be on-press developable.

22. A polymerizable composition comprising
   a polymerizable compound, and
   between about 10 and about 90 weight percent of a polymeric binder;
   wherein the polymeric binder is selected from the group consisting of at least one graft copolymer comprising a main chain polymer and polyethylene oxide side chains, a block copolymer having at least one polyethylene oxide block and at least one non-polyethylene oxide block, and a combination thereof;
   wherein the polymerizable composition comprises discrete particles of the graft or block copolymer.

23. The composition of claim 22, wherein the discrete particles are characterized by a diameter in the range from about 60 nm to about 300 nm.

24. The composition of claim 22, wherein the weight ratio of polymerizable compound to polymeric binder ranges from about 5:95 to about 95:5.

25. The composition of claim 22, wherein the polymerizable composition further comprises a radiation absorber which is capable of absorbing electromagnetic radiation in the range of about 300–1400 nm.

26. The composition of claim 22, wherein the polymerizable composition further comprises a free radical initiator system comprising an electron acceptor and a coinitiator capable of donating electrons, donating hydrogen atoms or forming a hydrocarbon radical.

27. The composition of claim 22, wherein the polyethylene oxide segments of the polyethylene oxide side chains or polyethylene oxide block have an average molecular weight ranging from about 500 to about 10,000.

28. The composition of claim 22, wherein the polymeric binder comprises at least one graft copolymer comprising a main chain polymer and polyethylene oxide side chains.

29. The composition of claim 22, wherein the non-polyethylene oxide block of the block copolymer is free of polyalkylene oxide segments.

30. The composition of claim 22, wherein the polymeric binder comprises a mixture of at least two copolymers independently comprising a graft copolymer comprising a main chain polymer and polyethylene oxide side chains or a block copolymer having at least one polyethylene oxide block and at least one non-polyethylene oxide block.

31. The composition of claim 30, wherein the polymeric binder comprises a mixture of graft copolymers each comprising a main chain polymer and polyethylene oxide side chains.

32. The composition of claim 30, wherein the mixture of copolymers comprises at least one graft copolymer not in the form of discrete particles.

33. A method for preparing a printing plate, the method comprising
providing a substrate;
applying a negative-working layer comprising a radiation sensitive composition onto the substrate, wherein the radiation sensitive composition comprises a polymerizable compound and a polymeric binder, wherein the polymeric binder is selected from the group consisting of at least one graft copolymer comprising polyethylene oxide side chains, a block copolymer having at least one polyethylene oxide block, and a combination thereof, and wherein the radiation sensitive composition comprises discrete particles of the graft or block copolymer;
imagewise exposing the negative-working layer to ultraviolet, visible, or infrared radiation; and
developing the negative-working layer to produce a printing plate.

34. The method of claim 33, wherein the discrete particles are characterized by a diameter in the range from about 60 nm to about 300 nm.

35. The method of claim 33, wherein the imagewise exposing step is carried out with infrared radiation using an infrared laser.

36. The method of claim 33, further comprising postbaking the printing plate after the developing step.

37. The method of claim 33, wherein the developing step is done on-press.

38. The method of claim 33, wherein the radiation sensitive composition comprises between about 10 and about 90 weight percent of the polymeric binder.

39. The method of claim 33, wherein the polymeric binder comprises at least one graft copolymer comprising a main chain polymer and polyethylene oxide side chains.

40. The method of claim 33, wherein the polyethylene oxide segments of the polyethylene oxide side chains or polyethylene oxide block have a number average molecular weight ranging from about 500 to about 10,000.

41. The method of claim 33, wherein the non-polyethylene oxide block of the block copolymer is free of polyalkylene oxide segments.

42. The method o claim 33, wherein the polymeric binder comprises a mixture of at least two copolymers independently comprising a graft copolymer comprising a main chain polymer and polyethylene oxide side chains or a block copolymer having at least one polyethylene oxide block and at least one non-polyethylene oxide block.

43. The method of claim 42, wherein the polymeric binder comprises a mixture of graft copolymers each comprising a main chain polymer and polyethylene oxide side chains.

44. The method of claim 42, wherein the mixture of copolymers comprises at least one graft copolymer not in the form of discrete particles.

45. A method of preparing an imageable element comprising:
providing a substrate; and
coating onto the substrate a radiation sensitive composition, the radiation sensitive composition comprising a polymerizable compound, a radiation absorber and between about 10 and about 90 weight percent of a polymeric binder selected from the group consisting of at least one graft copolymer comprising polyethylene oxide side chains, a block copolymer having at least one polyethylene oxide block, and a combination thereof;
wherein the radiation sensitive composition comprises discrete particles of the graft block copolymer.

46. The method of claim 45 wherein the coating step comprises drying the radiation sensitive composition.

47. The method of claim 45, wherein the polyethylene oxide segments of the polyethylene oxide side chains or polyethylene oxide block have a number average molecular weight ranging from about 500 to about 10,000.

48. The method of claim 45, wherein the non-polyethylene oxide block of the block copolymer is free polyalkylene oxide segments.

49. The method of claim 45, wherein the polymeric binder comprises at least one graft copolymer comprising a main chain polymer and polyethylene oxide side chains.

50. The method of claim 45, wherein the polymeric binder comprises a mixture of at least two copolymers independently comprising a graft copolymer comprising a main chain polymer and polyethylene oxide side chains or a block copolymer having at least one polyethylene oxide block and at least one non-polyethylene oxide block.

51. The method of claim 50, wherein the polymeric binder comprises a mixture of graft copolymers each comprising a main chain polymer and polyethylene oxide side chains.

52. The method of claim 50, wherein the mixture of copolymers comprises at least one graft copolymer not in the form of discrete particles.

53. The method of claim 45, wherein the imageable element is a printing plate precursor.

54. The method of claim 53, wherein the printing plate precursor is adapted to be on-press developable.

55. The method of claim 45, wherein the discrete particles are characterized by a diameter in the range from about 60 nm to about 300 nm.

56. The imageable element of claim 55, wherein the discrete particles of the block copolymer are characterized by a diameter in the range from about 60 nm to about 300 nm.

* * * * *